United States Patent [19]

Namizaki et al.

[11] 4,183,038
[45] Jan. 8, 1980

[54] SEMICONDUCTOR LASER DEVICE

[75] Inventors: Hirofumi Namizaki;. Wataru Susaki, both of Amagasaki; Hirofumi Kan, Moris, all of Japan

[73] Assignee: Mitsubishi Denki Kabushiki Kaisha, Tokyo, Japan

[21] Appl. No.: 892,407

[22] Filed: Mar. 29, 1978

[51] Int. Cl.² ............................................. H01L 33/00
[52] U.S. Cl. .................................... 357/17; 357/18; 357/58; 331/94.5 H
[58] Field of Search ............................. 357/17, 18, 58; 331/94.5 H

[56] References Cited

U.S. PATENT DOCUMENTS

| | | | |
|---|---|---|---|
| 3,961,996 | 6/1976 | Namizaki | 148/171 |
| 3,990,096 | 11/1976 | Namizaki | 357/18 |
| 4,065,729 | 12/1977 | Gover | 331/94.5 H |

*Primary Examiner*—Martin H. Edlow
*Attorney, Agent, or Firm*—Wenderoth, Lind & Ponack

[57] ABSTRACT

N type GaAlAs, GaAs and GaAlAs layers are successively grown on a semi-insulating GaAs substrate doped with Cr. Zn is diffused into predetermined portions of those layers to a depth reaching the substrate to form pn junctions between the original n type regions of the layers and their regions are converted to the p from the n type conductivity. The pn junction formed in the GaAs layer serves as a light emitting region.

10 Claims, 8 Drawing Figures

SEMICONDUCTOR LASER DEVICE

BACKGROUND OF THE INVENTION

This invention relates to a semiconductor laser device having a low threshold current and excellent temperature characteristics.

It is well known that several structures of semiconductor lasers have been produced in which the threshold current is decreased. Among them a laser structure known as the so-called transverse junction stripe (abbreviated as "TJS") laser is particularly excellent. That TJS laser oscillates in the single mode and the characteristics thereof are described in detail, for example, in an H. Namizaki article entitled "Transverse-Junction-Stripe Lasers with a GaAs p-n Homojunction," IEEE Fournal of Quantum Electronics, QE-11, Nov. 8, 1975, pages 427–431. However, the TJS laser has been disadvantageous in that a leakage current, not contributing to the laser oscillation, increases with an increase in current density and therefore a temperature rise is attended with a rapid increase in threshold current until the laser oscillation is ceased due to heat generated therein.

Accordingly it is an object of the present invention to provide a new and improved semiconductor laser device having an extremely low leakage current.

It is another object of the present invention to provide a new semiconductor laser device which is improved in the temperature dependency of the leakage current.

It is still another object of the present invention to provide a new and improved semiconductor laser device having a low threshold current and still a reduced rate of temperature change thereof.

SUMMARY OF THE INVENTION

The present invention provides a semiconductor laser device comprising an electrically semi-insulating semiconductor substrate, a first semiconductor layer of a first type conductivity formed on the semiconductor substrate, a second semiconductor layer of the first type conductivity formed on the first semiconductor layer and narrower in forbidden band-width than the first semiconductor layer, a third semiconductor layer of the first type conductivity formed on the second semiconductor layer and broader in forbidden band-width than the second semiconductor layer, a fourth semiconductor layer having a second type conductivity changed from the first type conductivity and occupying predetermined regions of the first, second and third semiconductor layers to reach the semiconductor substrate, the fourth semiconductor layer forming pn junctions with the first, second and third semiconductor layers, the pn junction in the second semiconductor layer serving as a light emitting region, a first electrode disposed in ohmic contact with a semiconductor region having the first type conductivity, and a second electrode disposed in ohmic contact with a semiconductor region having the second type conductivity.

In a preferred embodiment of the present invention the electrically semi-insulating semiconductor substrate may be formed of a high resistivity gallium arsenide (GaAs) doped with chromium (Cr). The first and third semiconductor layers may be formed of n type gallium-aluminum arsenide (GaAlAs) and the second semiconductor layer is formed of n type gallium arsenide (GaAs).

Advantageously the fourth semiconductor layer may be formed by diffusing a p type conductivity imparting impurity into the predetermined portions of the first, second and third semiconductor layers to a depth reaching the substrate.

BRIEF DESCRIPTION OF THE DRAWINGS

Other objects of the present invention will become apparent from the following detailed description taken in conjunction with the accompanying drawings in which:

FIG. 4b is a view similar to FIG. 4a but illustrating a modification of the arrangement shown in FIG. 4a;

FIG. 4c is a view similar to FIG. 4a but illustrating another modification of the arrangement shown in FIG. 4a;

Throughout the Figures like reference numerals designate the identical or corresponding components.

DESCRIPTION OF THE PREFERRED EMBODIMENTS

Figure 1:
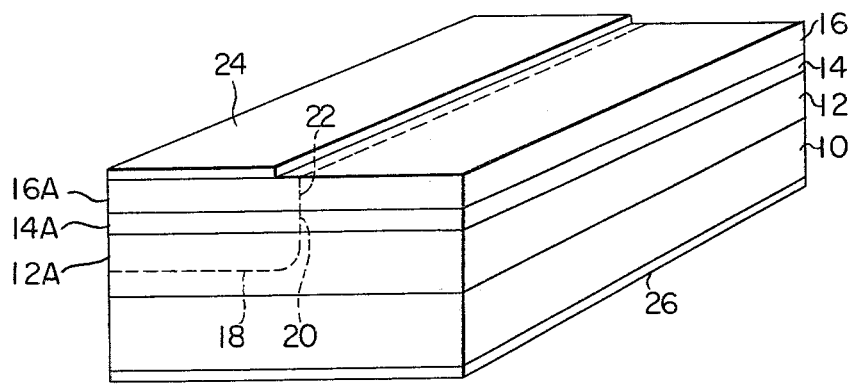
FIG. 1 is a perspective view of a semiconductor laser device constructed in accordance with the principles of the prior art.

Referring now to FIG. 1 of the drawings, there is illustrated the fundamental structure of conventional semiconductor laser devices such as TJS lasers as above described. The arrangement illustrated comprises an n type gallium arsenide (GaAs) substrate 10, and an n type gallium-aluminum arsenide (GaAlAs) layer 12, an n type gallium arsenide (GaAs) layer 14 and an n type gallium-aluminum arsenide (GaAlAs) layer 16 successively formed on one of the main faces of the n type semiconductor substrate according to a liquid epitaxial growth technique.

Then a p type conductivity imparting impurity such as zinc (Zn) is diffused into predetermined portions, in this case, the lefthand portions as viewed in FIG. 1 of the n type layers 16, 14 and 12 according to the selective diffusion technique to convert those predetermined layer portions to a p type conductivity thereby to form a p type GaAlAs layer 16A, a p type GaAl layer 14A and a p type GaAlAs layer 12A superposed on one another. The n type layer 12 includes a portion located beneath the p type layer 12A and having the conductivity type remaining unchanged. The p type layers 12A, 14A and 16A and the n type layers 12, 14 and 16 form respective pn junctions 18, 20 and 22 therebetween. Those PN junctions are continuous to one another.

Following this, a first electrode 24 is disposed in ohmic contact with the p type GaAlAs layer 16A and a second electrode 26 is disposed in ohmic contact with the main face of the n type substrate 10 resulting in the completed device.

Gallium arsenide (GaAs) is narrower in forbidden band-width than gallium-aluminum arsenide (GaAlAs) and therefore a pn junction with gallium arsenide can be rendered less in diffusion potential than a PN junction with gallium-aluminum arsenide. As a result, the application of a forward voltage across the electrodes 24 and 26 permits a great portion of the resulting current to be concentrated on the pn junction 18 between the GaAs layers 14a and 14 thereby to cause a laser oscillation at and adjacent to that pn junction.

However, although it could be said that the diffusion potential is high at the pn junction with gallium-aluminum arsenide, a current, would flow over the barrier formed by that pn junction, though the current would be low. The density of a current flowing through the junction with gallium arsenide will now be compared with the density of a current flowing a junction with gallium aluminum arsenide. Assuming that the gallium-aluminum arsenide ($Ga_{1-x}Al_xAs$) includes aluminum in a concentration x of 0.4, densities of currents following through the pn junctions with gallium arsenide and gallium-aluminum arsenide respectively have the ratio of about 1000 to 1 at room temperature with the currents approximating their threshold magnitudes.

On the other hand, the pn junction 20 with gallium arsenide has typically an area of $0.5 \times 300$ $\mu m^2$ while the pn junctions 18 and 22 with gallium-aluminum arsenide have typically a total area of about $50 \times 300$ $\mu m^2$. As the current is equal the current density multiplied by the area, currents flowing through the pn junctions 18 and 22 with gallium-aluminum arsenide amount to about 10% of the total current. Of course, this current does not contribute to the laser oscillation.

A rise in temperature and an increase in current density is attended with a further decrease in the ratio of current density and also an abrupt increase in leakage current. Accordingly a threshold current $I_{th}$ for laser oscillation is abruptly increased substantially following $I_{th} \propto T^7$ where T designates an absolute temperature. Eventually, the laser oscillation is ceased due to the generation of heat. In this connection, the threshold current $I_{th}$ may have the temperature dependency expressed by $I_{th} \propto T^3$ provided that a leakage current is negligible.

Figure 2:
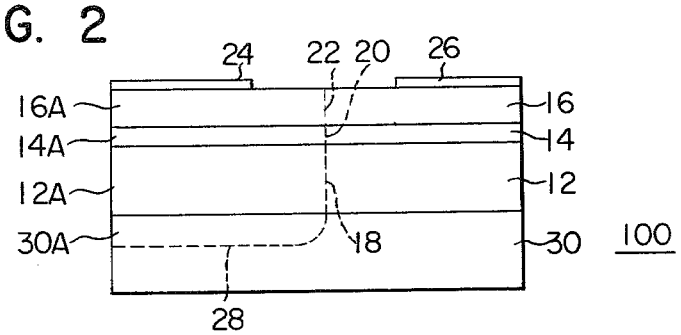
FIG. 2 is a cross sectional view of a semiconductor laser device constructed in accordance with the principles of the present invention.

Referring now to FIG. 2 there is illustrated a semiconductor laser device constructed in accordance with the principles of the present invention for the purpose of eliminating the disadvantages of the prior art practice as above described.

The arrangement illustrated comprises an electrically semi-insulating substrate 30 formed, for example, of a high resistivity gallium arsenide (GaAs) doped with chromium (Cr) or iron (Fe). The substrate 50 has normally a resistivity as high as from $10^4$ to $10^6$ ohms-centimeter and a thickness of about 70 microns.

As in the arrangement of FIG. 1, a liquid epitaxial growth technique or the like is used to grow an n type gallium-aluminum arsenide (GaAlAs) layer 12 on one of the main faces of the substrate 30 to a thickness of from 3 to 6 microns, and then to grow an n type gallium arsenide (GaAs) layer 16 on the n type layer 12 to a thickness of about 0.3 microns. Finally, an n type gallium-aluminum arsenide (GaAlAs) layer 16 is expitaxially grown on the n type layer 14 to a thickness of about 2 microns. The n type layers 12, 14 and 16 have impurity concentrations of about $2 \times 10^{17}$, $1.5 \times 10^{18}$ and $2 \times 10^{17}$ atoms per cubic centimeter respectively.

A semiconductor chip thus formed has a dimension of about $300 \times 300$ microns and is generally designated by the reference numeral 100.

As in the arrangement of FIG. 1, a p type conductivity imparting impurity such as zinc (Zn) is diffused into the chip 100 from a predetermined portion, in this case, the lefthand portion as viewed in FIG. 2 of the exposed surface of the n type gallium-aluminum arsenide layer 16 to convert diffused portions to a p type conductivity. As shown in FIG. 2, a diffusion front reaches the substrate 30. The diffused portion of the chip 100 has an impurity concentration of $1 \times 10^{19}$ atoms per cubic centimeter or more and is shown in FIG. 2 as having a lateral dimension or a width approximately equal to one half that of the chip but the width thereof is sufficient to be of about 50 microns. In the resulting structure, a p type layer 16A is formed in the n type layer 16 to form a PN junction 22 therebetween, a p type layer 14A is formed in the n type layer 14 to form a PN junction 20 therebetween and a p type layer 12A is formed in the n type layer 12 to form a PN junction 18 therebetween. A p type layer 30A is formed in the predetermined portion of the semi-insulating substrate 30 to form a pi junction 28 therebetween. The pn junctions 22, 20 and 18 are continuous to one another and the pn junctions 18 smoothly merges into the pi junction 28 in the substrate 30.

Then a pair of first and second electrodes 24 and 26 are disposed in ohmic contact with the p and n type gallium-aluminum arsenide layers 16A and 16 respectively by vacuum evaporation or electroplating technique. In this way the semiconductor laser device of the present invention has been completed.

Figure 3:
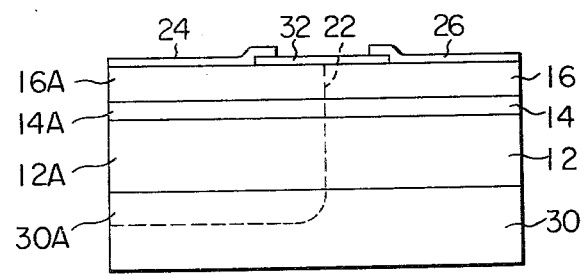
FIG. 3 is a view similar to FIG. 2 but illustrating a modification of the present invention.

FIG. 3 shows a modification of the present invention. As shown, an electrically insulating film 32 covers that portion of the exposed surface of the gallium-aluminum arsenide layer 16 and 16A having the end of the PN junction 22 exposed thereto and adjacent to the exposed end of the PN junction 22. The insulating film 32 may be formed of silicon dioxide ($SiO_2$), silicon nitride ($Si_3N_4$) or the like. The electrodes 24 and 26 include opposite end portions overhanging the adjacent edges of the insulating film 32. The insulating film 32 serves to protect the exposed end of the PN junction 22 ensuring the electrical insulation thereof.

Figure 4A:
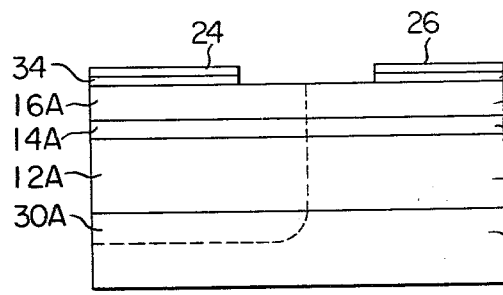
FIG. 4a is a view similar to FIG. 2 but illustrating amother modification of the present invention.

FIG. 4a shows another modification of the present invention. When the electrode is disposed in ohmic contact with the grown gallium-aluminum arsenide layer 16, the contact resistance developed therebetween becomes high. In order to avoid this objection, that grown layer is provided on the exposed surface with a gallium arsenide layer 34 with an impurity concentration of $1 \times 10^{19}$ atoms per cubic centimeter grown to a thickness of about 2 microns. Thereafter the diffusion of a p type conductivity imparting impurity is effected in the manner as above described in conjunction with FIG. 2. Therefore a pn junction is also formed in the gallium arsenide layer 34.

If it is attempted to apply the present invention directly to such a structure, then a leakage current can flow through the pn junction formed in the gallium arsenide layer 34. In order to prevent this flow of leakage current, that portion of the gallium arsenide layer 34 not overlaid with the electrodes 24 and 26 is etched away.

Figure 4C:
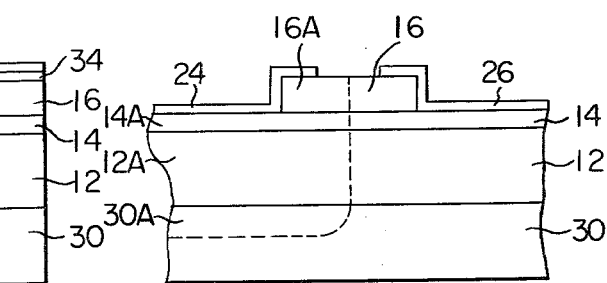
Figure 4B:
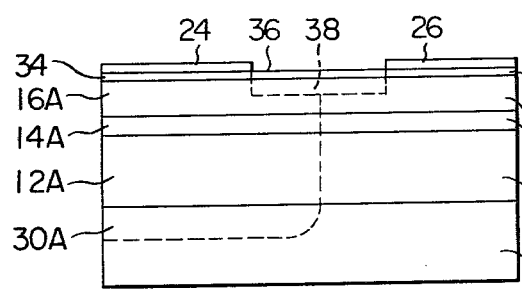

FIG. 4b shows a modification of the arrangement shown in FIG. 4a. In FIG. 4b, the implantation of protons or oxygenions is substituted for the etching to form a high resistance region 36 in that portion of the gallium arsenide layer 34 not overlaid with the electrodes 24 and 26 and also another high resistance region 38 in that portion of the gallium-aluminum arsenide layer 16 overlaid with the layer 36.

FIG. 4c show another modification of the arrangement shown in FIG. 4a. In the arrangement illustrated the edge portions of the n and p type gallium-aluminum arsenide layers 16 and 16A are selectively removed by etching to leave the central portion of the layers 16 and 16A. Then a pair of electrodes 24 and 26 similar to those shown in FIG. 3 are disposed in ohmic contact with the exposed surfaces of the p and n type gallium arsenide layers 14A and 14. Thus the electrodes 24 and 26 have opposite end portions overhanging adjacent edges of the exposed layers 14A and 14.

In other respects, the arrangement is substantially similar to that shown in FIG. 3. When the exposed surface portions of the gallium-aluminum arsenide layer 16 is sufficiently spaced away from a light emitting portion, the characteristics of laser oscillation is scarecely affected.

Figure 5:
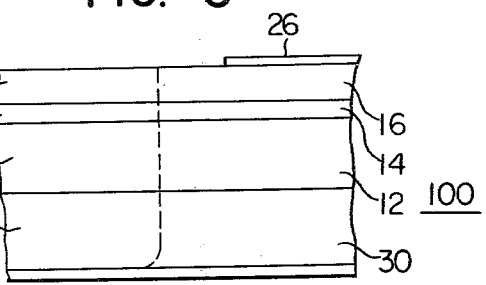
FIG. 5 is a view similar to FIG. 2 but illustrating still another modification of the present invention.

FIG. 5 shows another modification of the present invention. In the arrangement illustrated zinc (Zn) is diffused into the semiconductor chip 100 from one of the main faces, in this case, the upper main face as viewed in FIG. 5 thereof and deep enough to reach the other or lower main face thereof. Thus the p type region is exposed to both the upper and lower main faces of the semiconductor chip 100.

Then the first electrode 24 disposed in ohmic contact with the entire area of the lower main face of the chip 100 and the second electrode 26 is disposed in ohmic contact with the n type gallium-aluminum arsenide layer 16.

Therefore the electrodes are provided on the upper and lower main faces of the semiconductor chip as in conventional semiconductor devices. The resulting structure can be easily bonded to a heat sink or the like.

Any of the arrangements as shown in FIGS. 2 through 4 may readily be bonded to a heat sink or the like by using an electrically insulating material having a low thermal resistance.

Figure 6:
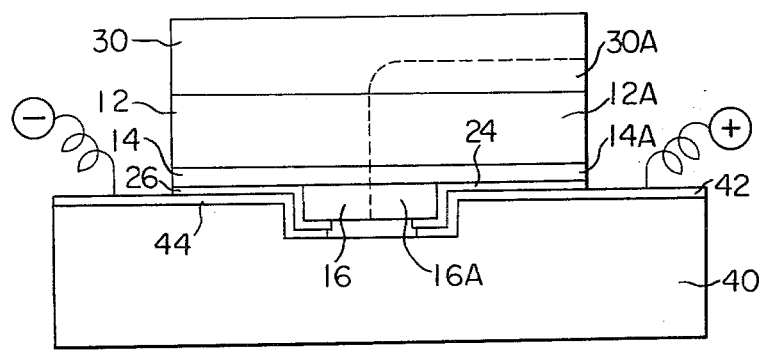
FIG. 6 is a cross sectional view of the arrangement as shown in FIG. 4c mounted to a heat sink.

FIG. 6 shows, by way of example, how the arrangement of FIG. 4c is mounted to a heat sink. The arrangement of FIG. 4c has its side with the electrodes fixedly secured to that side of a beryllia heat sink 40 complementary in configuration to that side of the arrangement with solder layers 42 and 44 interposed between the first and second electrodes 24 and 26 and the heat sink 40. Then the electrodes 24 and 26 are connected to a positive and a negative side of a DC source as shown by the positive and the negative signs within circles.

From the foregoing it is seen that the present invention is different from conventional devices in that an electrically semi-insulating substrate 30 formed of gallium arsenide (GaAs) doped with chromium (Cr) is substituted for the conventional n type gallium arsenide substrate and the diffusion with zinc is deep effected enough to cause its front to reach the semi-insulating substrate. Also because of the use of the semi-insulating substrate, the second electrode 26 is inevitably disposed in ohmic contact with the surface of the uppermost grown layer, that is, the n type gallium-aluminum arsenide layer 16. This measure prevents the diffusion front 28 from forming a pn junction and a leakage current from flowing through the diffusion front for the following reasons: The resistivity on the order of $10^6$ ohms-centimeter can readily be imparted to chromium doped substrates. This figure is equal to about $10^8$ times the resistivity of grown layers. Therefore no current flows through this layer.

Under these circumstances a leakage current is permitted only to flow through the pn junctions 18 and 22 formed between the p and n type gallium-aluminum layers 12A and 12 and between the similar layers 16A and 16 respectively. The total area of those junctions can readily be on the order of $2 \times 300$ $\mu m^2$, which figure is on the order of one twentieth that provided by conventional devices. This is because the junction 18 includes no portion extending in parallel to the main face of the chip 100. Since the leakage current has a magnitude proportional to that area, it is on the order of one twentieth as compared with the prior art practice and can be substantially negligible. Also a rise in threshold current $I_{th}$ due to a temperature T may be approximately expressed by $I_{th} \propto T^3$. This means that the semiconductor laser device of the present invention is enabled to continue to sufficiently oscillate even with a temperature raised to several tens of temperatures in Centigrade from room temperature.

As above described, a p type conductivity imparting impurity is diffused into a semiconductor chip so as to reach an electrically insulating substrate involved to form various p type layers. This eliminates the necessity of precisely controlling a depth of diffusion resulting in the extremely simplified manufacturing of semiconductor laser devices.

While the present invention has been illustrated and described in conjunction with a few preferred embodiments thereof it is to be understood that numerous changes and modifications may be resorted to without departing from the spirit and scope of the present invention. For example, while the present invention has been described in terms of two semiconductive materials, that is, gallium arsenide and gallium-aluminum arsenide, it is to be understood that the present invention is equal applicable to three or more semiconductor materials having different forbidden band-widths. Also the present invention is equally applicable to the conductivity type reversed from that illustrated.

What we claim is:

1. A semiconductor laser device comprising an electrically semi-insulating semiconductor substrate, a first semiconductor layer of a first type conductivity formed on said semiconductor substrate, a second semiconductor layer of the first type conductivity formed on said first semiconductor layer and narrower in forbidden band-width than said first semiconductor layer, a third semiconductor of the first type conductivity formed on said second semiconductor layer and broader in forbidden band-width than said second semiconductor layer, a fourth semiconductor portion of a second type conductivity continuously formed in predetermined regions of said first, second and third semiconductor layers and extending into said semiconductor substrate, said fourth semiconductor portion forming pn junctions with said first, second and third semiconductor layers, the pn junction in said second semiconductor layer serving as a light emitting region, a first electrode disposed in ohmic contact with a semiconductor region having said first type conductivity and a second electrode disposed in ohmic contact with a semiconductor region having said second type conductivity.

2. A semiconductor laser device as claimed in claim 1 wherein said electrically semi-insulating semiconductor substrated is formed of high resistivity gallium arsenide (GaAs) doped with chromium.

3. A semiconductor laser device as claimed in claim 1 wherein said first type conductivity is of an n type and said second type conductivity is of a p type.

4. A semiconductor laser device as claimed in claim 1 wherein said first and third semiconductivity are formed of n type gallium-aluminum arsenide (GaAlAs) and said second semiconductor layer is formed of n type gallium arsenide (GaAs).

5. A semiconductor laser device as claimed in claim 4 wherein said fourth semiconductor portion is formed by diffusing a p type conductivity imparting impurity into said predetermined region of said first, second and third semiconductor layers to reach said semiconductor substrate.

6. A semiconductor laser device as claimed in claim 5 wherein said p type conductivity imparting impurity is zinc (Zn).

7. A semiconductor laser device as claimed in claim 1 wherein said pn junctions include an exposed end covered with an electrically insulating film.

8. A semiconductor laser device as claimed in claim 7 wherein said electrically insulating film is formed of a compound selected from the group consisting of silicon dioxide and silicon nitride.

9. A semiconductor laser device as claimed in claim 1 wherein said first electrode is disposed in ohmic contact with said fourth semiconductor portion and said second electrode is disposed in ohmic contact with a portion of said third semiconductor layer in which said fourth semiconductor portion is not formed therein.

10. A semiconductor laser device as claimed in claim 8 wherein said first and second electrode are disposed in ohmic contact with respective gallium arsenide layers formed on said third semiconductor layer.

* * * * *